United States Patent
Su et al.

(10) Patent No.: US 8,789,007 B2
(45) Date of Patent: Jul. 22, 2014

(54) COMPUTING DEVICE AND METHOD FOR VIEWING RELEVANT CIRCUITS OF SIGNAL ON CIRCUIT DESIGN DIAGRAM

(71) Applicant: Hon Hai Precision Industry Co., Ltd., New Taipei (TW)

(72) Inventors: Sheng-Wei Su, New Taipei (TW); Po-Wei Wang, New Taipei (TW); Bo-Hong Lin, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 14/050,394

(22) Filed: Oct. 10, 2013

(65) Prior Publication Data

US 2014/0123096 A1    May 1, 2014

(30) Foreign Application Priority Data

Oct. 26, 2012  (TW) .............................. 101139668 A

(51) Int. Cl.
*G06F 17/50*    (2006.01)
(52) U.S. Cl.
USPC ........................... 716/136; 716/111; 716/137
(58) Field of Classification Search
USPC ........................................ 716/111, 136–137
See application file for complete search history.

(56) References Cited

U.S. PATENT DOCUMENTS

| | | | | |
|---|---|---|---|---|
| 5,371,683 A | * | 12/1994 | Fukazawa et al. | 716/101 |
| 5,745,371 A | * | 4/1998 | Shouen | 716/102 |
| 6,253,365 B1 | * | 6/2001 | Baldwin | 716/102 |
| 6,460,148 B2 | * | 10/2002 | Veenstra et al. | 714/39 |
| 6,691,301 B2 | * | 2/2004 | Bowen | 717/114 |
| 7,280,953 B2 | * | 10/2007 | Fujimori et al. | 703/14 |
| 7,552,024 B2 | * | 6/2009 | Kelbon et al. | 702/117 |
| 7,571,086 B2 | * | 8/2009 | Chang et al. | 703/14 |
| 7,921,390 B2 | * | 4/2011 | Archambeault et al. | 716/106 |
| 8,060,852 B1 | * | 11/2011 | Varma et al. | 716/136 |
| 8,136,065 B2 | * | 3/2012 | Huang et al. | 716/106 |
| 8,397,214 B2 | * | 3/2013 | Hudson et al. | 717/109 |
| 2001/0037477 A1 | * | 11/2001 | Veenstra et al. | 714/41 |
| 2009/0150839 A1 | * | 6/2009 | Huang et al. | 716/5 |

* cited by examiner

*Primary Examiner* — Naum Levin
(74) *Attorney, Agent, or Firm* — Novak Druce Connolly Bove + Quigg LLP

(57) ABSTRACT

In a method for viewing relevant circuits of a signal on a circuit design diagram of a printed circuit board (PCB), a circuit design diagram and a circuit testing program of the PCB are read from a storage system. A state of each signal of the PCB on the circuit design diagram is determined. Accordingly, sub circuit design diagrams of the signal are obtained from the circuit design diagram and stored into the storage device. When a testing instruction is selected from the circuit testing program, a signal of the PCB is determined. Sub circuit design diagrams of the determined signal are retrieved from the storage device and displayed on a display device.

9 Claims, 4 Drawing Sheets

COMPUTING DEVICE AND METHOD FOR VIEWING RELEVANT CIRCUITS OF SIGNAL ON CIRCUIT DESIGN DIAGRAM

BACKGROUND

1. Technical Field

The embodiments of the present disclosure relate to signal testing technology, and particularly to a computing device and a method for viewing relevant circuits of a signal on a circuit design diagram.

2. Description of Related Art

Signal testing of components on a printed circuit board (PCB) is an important phase in the manufacturing process and is closely interrelated to product quality. A circuit testing program is executed to test signals on the PCB. When a signal is distorted or erroneous, a user needs to check relevant circuits of the signal on a circuit design diagram of the PCB. However, determining the relevant circuits of the signal on the circuit design diagram is tiring and time-consuming.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

In general, the word "module", as used herein, refers to logic embodied in computing or firmware, or to a collection of software instructions, written in a programming language, such as, JAVA, C, or assembly. One or more software instructions in the modules may be embedded in firmware, such as in an erasable programmable read only memory (EPROM). The modules described herein may be implemented as either software and/or computing modules and may be stored in any type of non-transitory computer-readable medium or other storage device. Some non-limiting examples of non-transitory computer-readable media include CDs, DVDs, BLU-RAY, flash memory, and hard disk drives.

Figure 1:
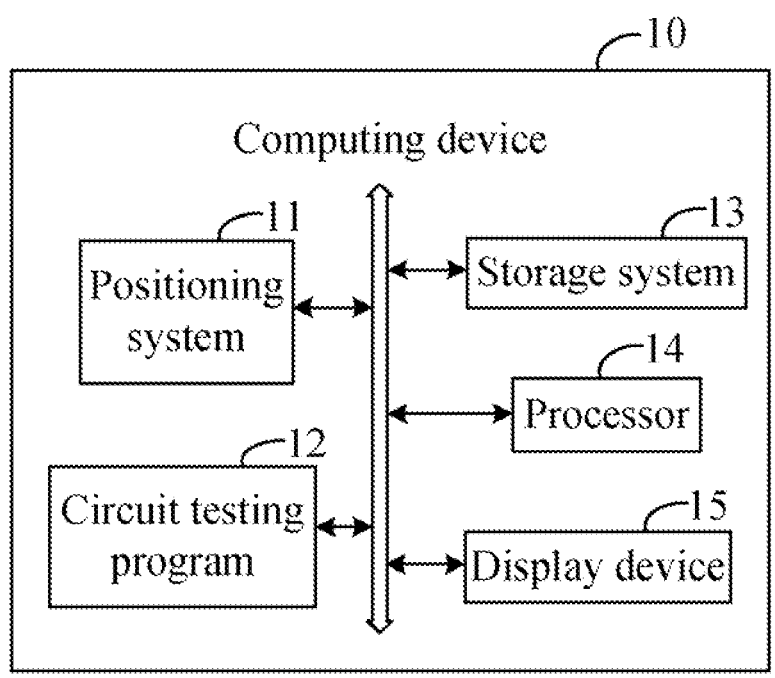
FIG. 1 is one embodiment of an application of a computing device.

FIG. 1 is one embodiment of an application of a computing device 10. The computing device 10 includes a positioning system 11 and a circuit testing program 12. The circuit testing program 12 includes a number of testing instructions used to test signals on a printed circuit board (PCB). The positioning system 11 determines and displays relevant circuits of a signal on a circuit design diagram of the PCB when the circuit testing program 12 is executed to test the signal.

The computing device 10 further includes a storage system 13, at least one processor 14, and a display device 15. The storage system 13 may be a dedicated memory, such as an EPROM, a hard disk drive (HDD), or flash memory. In some embodiments, the storage system 13 may also be an external storage device, such as an external hard disk, a storage card, or other data storage medium.

Figure 2:
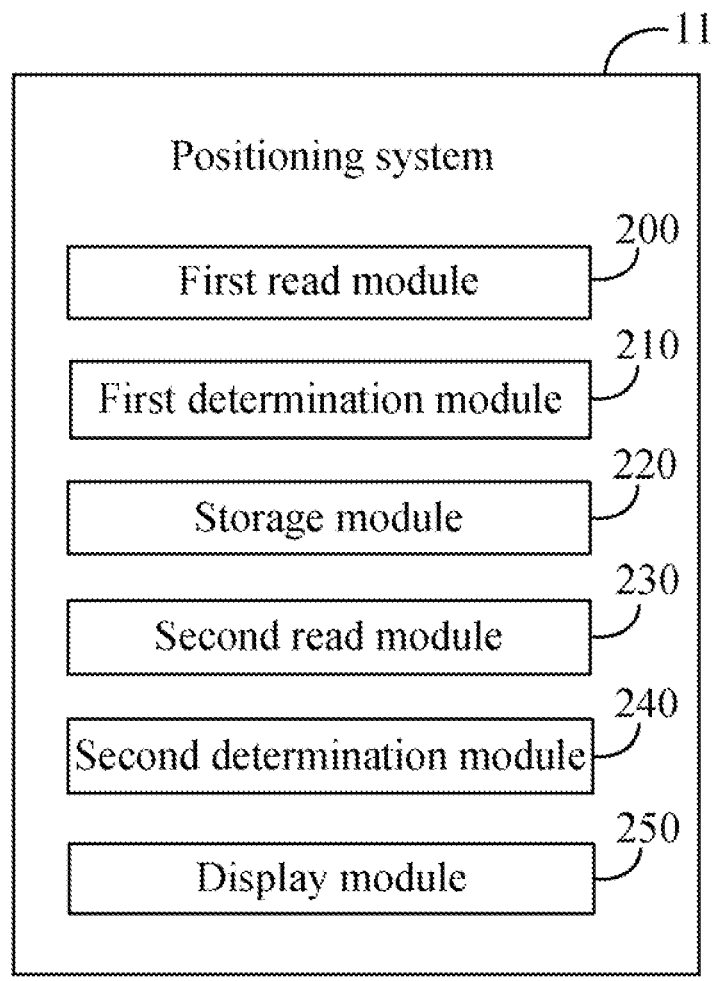
FIG. 2 is a block diagram of one embodiment of function modules of a positioning system of the computing device in FIG. 1.

FIG. 2 is a block diagram of one embodiment of function modules of the positioning system 11 shown in FIG. 1. The positioning system 11 includes a first read module 200, a first determination module 210, a storage module 220, a second read module 230, a second determination module 240, and a display module 250. The modules 200-250 may comprise computerized code in the form of one or more programs that are stored in the storage system 13. The computerized code includes instructions that are executed by the at least one processor 14, to provide the aforementioned functions of the positioning system 11. A detailed description of the functions of the modules 200-250 is given below in reference to FIG. 3.

Figure 3:
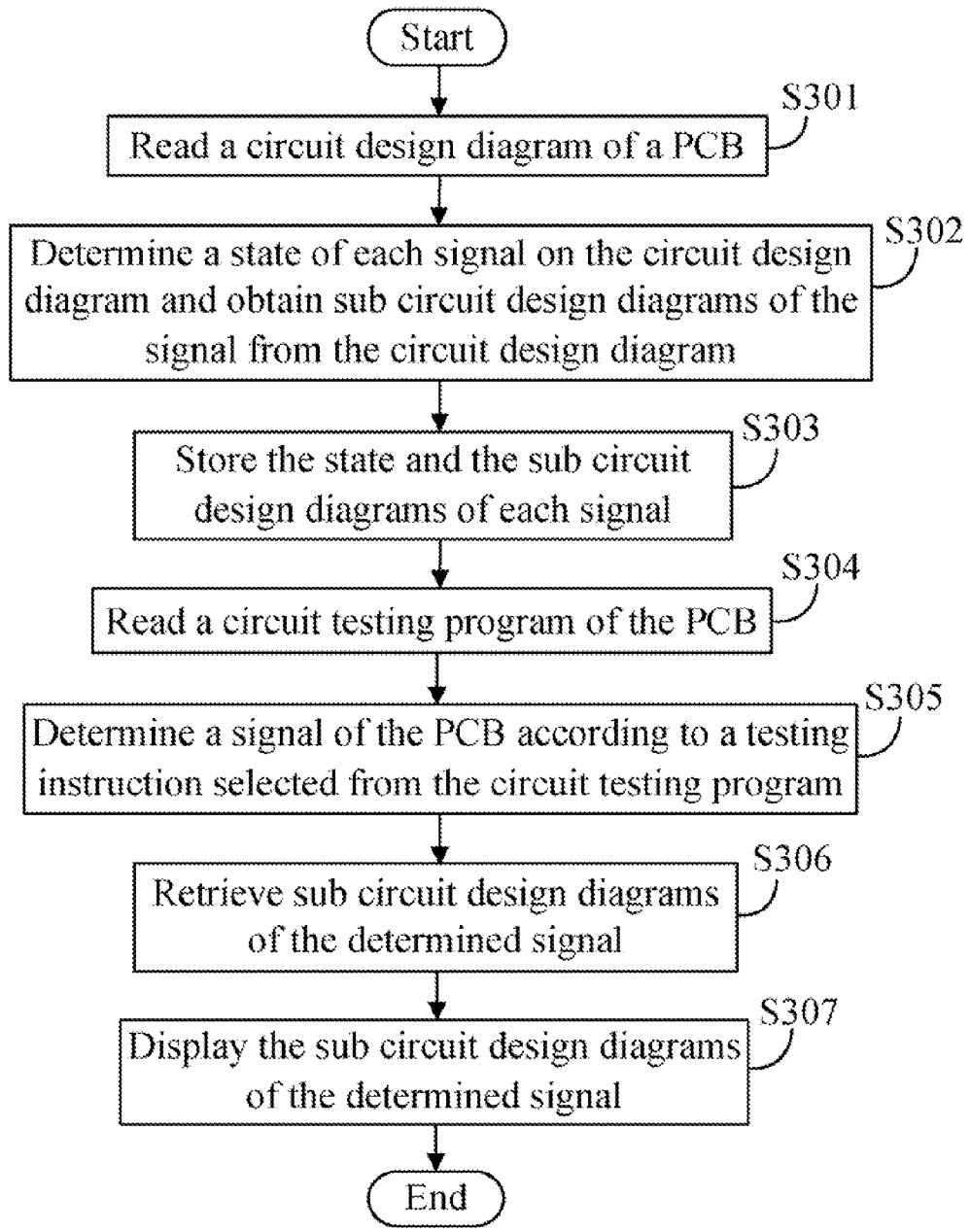
FIG. 3 is a flowchart of one embodiment of a method for viewing relevant circuits of a signal on a circuit design diagram of a printed circuit board (PCB) using the computing device in FIG. 1.

FIG. 3 is a flowchart of one embodiment of a method for viewing relevant circuits of a signal on a circuit design diagram of the PCB using the computing device 10 in FIG. 1. Depending on the embodiment, additional steps may be added, others removed, and the ordering of the steps may be changed.

In step S301, the first read module 200 reads the circuit design diagram from the storage system 13. The circuit design diagram may be a schematic diagram or an integrated circuit layout. The schematic diagram describes components and connections between the components in the PCB. The schematic diagram uses iconic symbols to represent the components, with lines representing the connections between the components. The integrated circuit layout describes physical locations and physical connections of the components in the PCB.

In step S302, the first determination module 210 determines a state of each signal to be tested on the circuit design diagram, and obtains one or more sub circuit design diagrams of the signal from the circuit design diagram. Each sub circuit design diagram of a signal represents a relevant circuit of the signal, which describes a connection of the signal. In one example, each signal is assigned a name that is drawn on the circuit design diagram. The first determination module 210 finds the name of the signal to determine the state of the signal on the circuit design diagram. In one embodiment, the circuit design diagram is a digital image, such as a Joint Photographic Experts Group (JPEG) image. The first determination module 210 may determine the state of the signal on the circuit design diagram using an image matching algorithm. The circuit design diagram may be pre-divided into a plurality of sub circuit design diagrams. If one sub circuit design diagram includes the signal, the sub circuit design diagram is a sub circuit design diagram of the signal. In one example, the circuit design diagram is divided into the sub circuit design diagrams based on the components of the PCB. Each of the sub circuit design diagrams includes one or more components of the PCB.

In step S303, the storage module 220 stores the state and the sub circuit design diagrams of each signal into the storage device 13. The storage module 220 may create a database in the storage device 13 to store the state and the sub circuit design diagrams of the signal.

In step S304, the second read module 230 reads the circuit testing program 12 from the storage system 13. The circuit testing program 12 includes a number of testing instructions. Each testing instruction is used to test a specific signal in the PCB. In one example, the circuit testing program 12 includes a testing instruction "Set LOW PS_ON1" for setting a signal "PS_ON1" as a low level voltage. In another example, the circuit testing program 12 includes a testing instruction "Set HIGH PS_ON1" for setting the signal "PS_ON1" as a high level voltage.

When one of the testing instructions is selected by a user, in step S305, the second determination module 240 determines a specific signal of the PCB according to the testing instruction. For example, if a testing instruction "Set HIGH PS_ON1" is selected by the user, the second determination module 240 determines a signal "PS_ON1" according to the testing instruction.

In step S306, the second determination module 240 retrieves sub circuit design diagrams of the determined signal from the storage device 13. For example, if the signal "PS_ON1" is determined, the second determination module 240 retrieves sub circuit design diagrams "FIG1_PS_ON1," "FIG2_PS_ON1," and "FIG3_PS_ON1" from the storage device 13.

Figure 4:
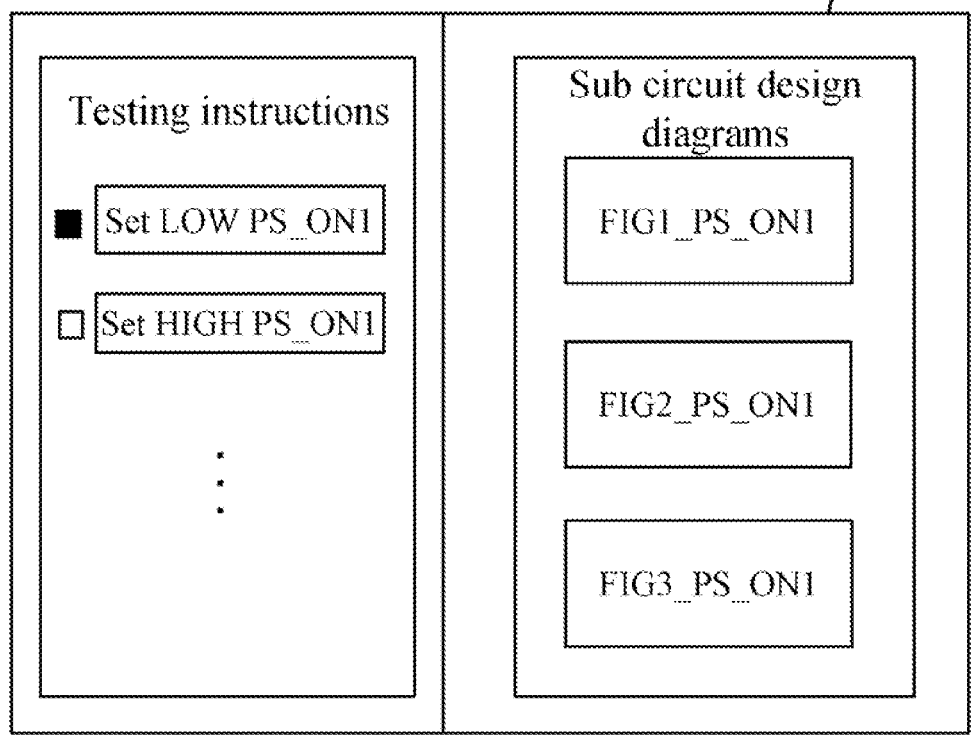
FIG. 4 is one embodiment illustrating sub circuit design diagrams of a signal.

In step S307, the display module 250 displays the sub circuit design diagrams of the determined signal on the display device 15. In one example with respect to FIG. 4, sub circuit design diagrams "FIG1_PS_ON1," "FIG2_PS_ON1," and "FIG3_PS_ON1" of the signal "PS_ON1" are displayed on the display device 15. According to the sub circuit design diagrams, the user can check relevant circuits of the determined signal directly. Therefore, testing efficiency is increased and testing time is decreased.

Although certain disclosed embodiments of the present disclosure have been specifically described, the present disclosure is not to be construed as being limited thereto. Various changes or modifications may be made to the present disclosure without departing from the scope and spirit of the present disclosure.

What is claimed is:

1. A method for viewing relevant circuits of a signal on a circuit design diagram of a printed circuit board (PCB) being executed by a processor of a computing device, the method comprising:

reading the circuit design diagram stored in a storage system;

determining a state of each signal of the PCB on the circuit design diagram using an image matching algorithm, and obtaining one or more sub circuit design diagrams of the signal from the circuit design diagram according to the state of the signal on the circuit design diagram;

storing the state and the sub circuit design diagrams of each signal into the storage device;

reading a circuit testing program of the PCB stored in the storage system;

determining a specific signal of the PCB when a testing instruction is selected from the circuit testing program, and retrieving sub circuit design diagrams of the determined signal from the storage device; and displaying the sub circuit design diagrams of the determined signal on a display device.

2. The method of claim 1, wherein the circuit design diagram is a schematic diagram or an integrated circuit layout.

3. The method of claim 1, wherein the circuit design diagram is divided into a plurality of sub circuit design diagrams based on components of the PCB.

4. A computing device, comprising:
at least one processor; and a storage system storing a plurality of instructions, which when executed by the at least one processor, cause the at least one processor to:

read a circuit design diagram of a printed circuit board (PCB) stored in the storage system;

determine a state of each signal of the PCB on the circuit design diagram using an image matching algorithm and obtain one or more sub circuit design diagrams of the signal from the circuit design diagram according to the state of the signal on the circuit design diagram;

store the state and the sub circuit design diagrams of each signal into the storage device;

read a circuit testing program of the PCB from the storage system;

determine a specific signal of the PCB when a testing instruction is selected from the circuit testing program, and retrieve sub circuit design diagrams of the determined signal from the storage device; and display the sub circuit design diagrams of the determined signal on a display device.

5. The computing device of claim 4, wherein the circuit design diagram is a schematic diagram or an integrated circuit layout.

6. The computing device of claim 4, wherein the circuit design diagram is divided into a plurality of sub circuit design diagrams based on components of the PCB.

7. A non-transitory computer-readable storage medium storing a set of instructions, the set of instructions capable of being executed by a processor of a computing device to implement a method for viewing relevant circuits of a signal on a circuit design diagram of a printed circuit board (PCB), the method comprising:

reading a circuit design diagram of the PCB stored in a storage system;

determining a state of each signal of the PCB on the circuit design diagram using an image matching algorithm and obtaining one or more sub circuit design diagrams of the signal from the circuit design diagram according to the state of the signal on the circuit design diagram;

storing the state and the sub circuit design diagrams of each signal into the storage device;

reading a circuit testing program of the PCB from the storage system;

determining a specific signal of the PCB when a testing instruction is selected from the circuit testing program, and retrieving sub circuit design diagrams of the determined signal from the storage device; and displaying the sub circuit design diagrams of the determined signal on a display device.

8. The storage medium of claim 7, wherein the circuit design diagram is a schematic diagram or an integrated circuit layout.

9. The storage medium of claim 7, wherein the circuit design diagram is divided into a plurality of sub circuit design diagrams based on components of the PCB.

* * * * *